(12) United States Patent
Ishiwata et al.

(10) Patent No.: US 8,379,429 B2
(45) Date of Patent: Feb. 19, 2013

(54) DOMAIN WALL MOTION ELEMENT AND MAGNETIC RANDOM ACCESS MEMORY

(75) Inventors: Nobuyuki Ishiwata, Tokyo (JP); Tetsuhiro Suzuki, Tokyo (JP); Norikazu Ohshima, Tokyo (JP); Kiyokazu Nagahara, Tokyo (JP); Shunsuke Fukami, Tokyo (JP)

(73) Assignee: NEC Corporation, Tokyo (JP)

( * ) Notice: Subject to any disclaimer, the term of this patent is extended or adjusted under 35 U.S.C. 154(b) by 238 days.

(21) Appl. No.: 12/864,056

(22) PCT Filed: Jan. 13, 2009

(86) PCT No.: PCT/JP2009/050287
§ 371 (c)(1),
(2), (4) Date: Jul. 22, 2010

(87) PCT Pub. No.: WO2009/101827
PCT Pub. Date: Aug. 20, 2009

(65) Prior Publication Data
US 2011/0129691 A1    Jun. 2, 2011

(30) Foreign Application Priority Data
Feb. 13, 2008    (JP) .................................. 2008-031816

(51) Int. Cl.
*G11C 19/00* (2006.01)
(52) U.S. Cl. .... 365/80; 428/810; 428/811.4; 428/811.5; 365/158; 365/171; 365/189.14; 257/421
(58) Field of Classification Search ......................... None
See application file for complete search history.

(56) References Cited

U.S. PATENT DOCUMENTS

| | | | |
|---|---|---|---|
| 3,369,225 A * | 2/1968 | Fuller | 365/87 |
| 6,781,871 B2 | 8/2004 | Park et al. | |
| 7,042,036 B2 * | 5/2006 | Chung et al. | 257/295 |
| 7,501,688 B2 * | 3/2009 | Saito | 257/421 |
| 7,626,856 B2 * | 12/2009 | Ono | 365/158 |
| 7,876,595 B2 * | 1/2011 | Xi et al. | 365/80 |
| 7,929,342 B2 * | 4/2011 | Numata et al. | 365/171 |
| 2009/0141541 A1 * | 6/2009 | Covington | 365/158 |
| 2011/0096593 A1 * | 4/2011 | Ranjan et al. | 365/158 |

FOREIGN PATENT DOCUMENTS

| | | |
|---|---|---|
| JP | 11-337527 A | 12/1999 |
| JP | 2005123617 A | 5/2005 |
| JP | 2005150303 A | 6/2005 |

(Continued)

OTHER PUBLICATIONS

International Search Report for PCT/JP2009/050287 mailed Apr. 21, 2009.

*Primary Examiner* — Kevin Bernatz

(57) ABSTRACT

A domain wall motion element has a magnetic recording layer 10 that is formed of a ferromagnetic film and has a domain wall DW. The magnetic recording layer 10 has: a pair of end regions 11-1 and 11-2 whose magnetization directions are fixed; and a center region 12 sandwiched between the pair of end regions 11-1 and 11-2, in which the domain wall. DW moves. A first trapping site TS1 by which the domain wall DW is trapped is formed at a boundary between the end region 11-1, 11-2 and the center region 12. Furthermore, at least one second trapping site TS2 by which the domain wall DW is trapped is formed within the center region 12.

15 Claims, 12 Drawing Sheets

FOREIGN PATENT DOCUMENTS

| | | | |
|---|---|---|---|
| JP | 2005191032 A | 7/2005 |
| JP | 2007123640 A | 5/2007 |
| JP | 2007227923 A | 9/2007 |
| WO | 2005069368 A | 7/2005 |
| WO | 2006046591 A | 5/2006 |
| WO | 2007015474 A | 2/2007 |

* cited by examiner

Fig. 18

| RESISTANCE VALUE Up | • WORD LINE WL=H<br>• BIT LINE BL1=H<br>• BIT LINE BL2=L |
|---|---|
| RESISTANCE VALUE Down | • WORD LINE WL=H<br>• BIT LINE BL1=L<br>• BIT LINE BL2=H |
| READ | • BIT LINE BL1=open<br>• BIT LINE BL2=H |

DOMAIN WALL MOTION ELEMENT AND MAGNETIC RANDOM ACCESS MEMORY

This application is the National Phase of PCT/JP2009/050287, filed Jan. 13, 2009, which is based upon and claims the benefit of priority from Japanese patent application No. 2008-031816, filed on Feb. 13, 2008, the disclosure of which is incorporated herein in its entirety by reference.

TECHNICAL FIELD

The present invention relates to a domain wall motion element and a magnetic random access memory (MRAM: Magnetic Random Access Memory) of a domain wall motion type.

BACKGROUND ART

A spin momentum transfer method recently proposed is one of promising data writing methods for an MRAM. According to spin transfer magnetization switching, a spin polarized current as a write current is injected into a magnetic recording layer and thereby a magnetization direction of the magnetic recording layer is switched. In a case of conventionally-known magnetization switching due to application of a current-induced magnetic field, a current required for the magnetization switching increases as a size of a memory cell becomes smaller. In contrast, in the case of the spin transfer magnetization switching, a current required for the magnetization switching decreases as a size of a memory cell becomes smaller. Therefore, the spin momentum transfer method is considered to be a promising method for achieving a high-capacity MRAM.

However, in a case where the spin momentum transfer method is applied to a magnetic tunnel junction (MTJ: Magnetic Tunnel Junction) element, it is necessary to overcome a problem of destruction of a tunnel barrier layer. When the magnetization switching is performed by the spin momentum transfer method, the spin polarized current is so supplied in the magnetic tunnel junction as to pass through the tunnel barrier layer. Here, as the case now stands, the spin polarized current as much as mA is required for the spin transfer magnetization switching. To supply such a large current through the magnetic tunnel junction may cause destruction of the tunnel barrier layer.

Moreover, in the case of the magnetic tunnel junction element of the spin momentum transfer type, both of a write current and a read current flow through the same path. Therefore, the so-called read disturb problem that data writing is performed at a time of data reading is caused. The read disturb problem becomes remarkable when the write current is reduced in order to prevent the above-mentioned destruction of the tunnel barrier layer.

In order to avoid the read disturb problem, it is necessary to reduce the read current. In this case, however, a read output becomes smaller and thus a special read circuit is necessary. As a result, it becomes difficult to achieve a high-speed data reading. Moreover, in a case of SoC embedded, circuit overhead is increased, which interferes with the embedded.

One approach to overcome the above-described problems is a technique that causes magnetization switching by supplying a spin polarized current in an in-plane direction of a magnetic recording layer. Such a technique is disclosed, for example, in Japanese Patent Publication JP-2005-191032A, Japanese Patent Publication JP-2005-123617A and U.S. Pat. No. 6,781,871. The spin polarized current is supplied in the in-plane direction of the magnetic recording layer, which causes a domain wall in the magnetic recording layer to move and thereby the magnetization in the magnetic recording layer is switched. From that viewpoint, this technique is called a "domain wall motion method". An element based on the domain wall motion method is hereinafter referred to as a "domain wall motion element". According to the domain wall motion method, it is not necessary to supply the spin polarized current so as to pass through the tunnel barrier layer, and thus the destruction of the tunnel barrier layer can be avoided effectively. Furthermore, since respective paths of the write current and the read current are different from each other, the read disturb problem can be avoided.

DISCLOSURE OF INVENTION

The domain wall motion element disclosed in the above-mentioned related documents is configured such that the domain wall is trapped at a position corresponding to data "0" or "1", and the data "0" or "1" is determined based on variation in a resistance value depending on the position of the domain wall. That is to say, the domain wall motion element disclosed in the above-mentioned related documents does not support a multivalued operation and an analog operation.

An object of the present invention is to provide a domain wall motion element and an MRAM that are capable of a multivalued operation.

In a first aspect of the present invention, a domain wall motion element is provided. The domain wall motion element has a magnetic recording layer that is formed of a ferromagnetic film and has a domain wall. The magnetic recording layer includes: a pair of end regions whose magnetization directions are fixed; and a center region sandwiched between the pair of end regions, in which the domain wall moves. A first trapping site by which the domain wall is trapped is formed at a boundary between the end region and the center region. Moreover, at least one second trapping site by which the domain wall is trapped is formed within the center region.

In a second aspect of the present invention, a magnetic random access memory of a domain wall motion type having a plurality of memory cells that are arranged in an array form is provided. Each of the plurality of memory cells has a domain wall motion element. The domain wall motion element has a magnetic recording layer that is formed of a ferromagnetic film and has a domain wall. The magnetic recording layer includes: a pair of end regions whose magnetization directions are fixed; and a center region sandwiched between the pair of end regions, in which the domain wall moves. A first trapping site by which the domain wall is trapped is formed at a boundary between the end region and the center region. Moreover, at least one second trapping site by which the domain wall is trapped is formed within the center region.

The domain wall motion element and the MRAM according to the present invention are capable of a multivalued operation.

BRIEF DESCRIPTION OF DRAWINGS

The above and other objects, advantages and features of the present invention will be more apparent from the following description of certain exemplary embodiments taken in conjunction with the accompanying drawings.

FIG. 18 briefly shows data writing/reading with respect to the MRAM according to the present exemplary embodiment.

DESCRIPTION OF EMBODIMENTS

A domain wall motion element according to an exemplary embodiment of the present invention and an MRAM using the domain wall motion element as a memory cell will be described with reference to the attached drawings.

1. Summary of Domain Wall Motion Element

Figure 1:
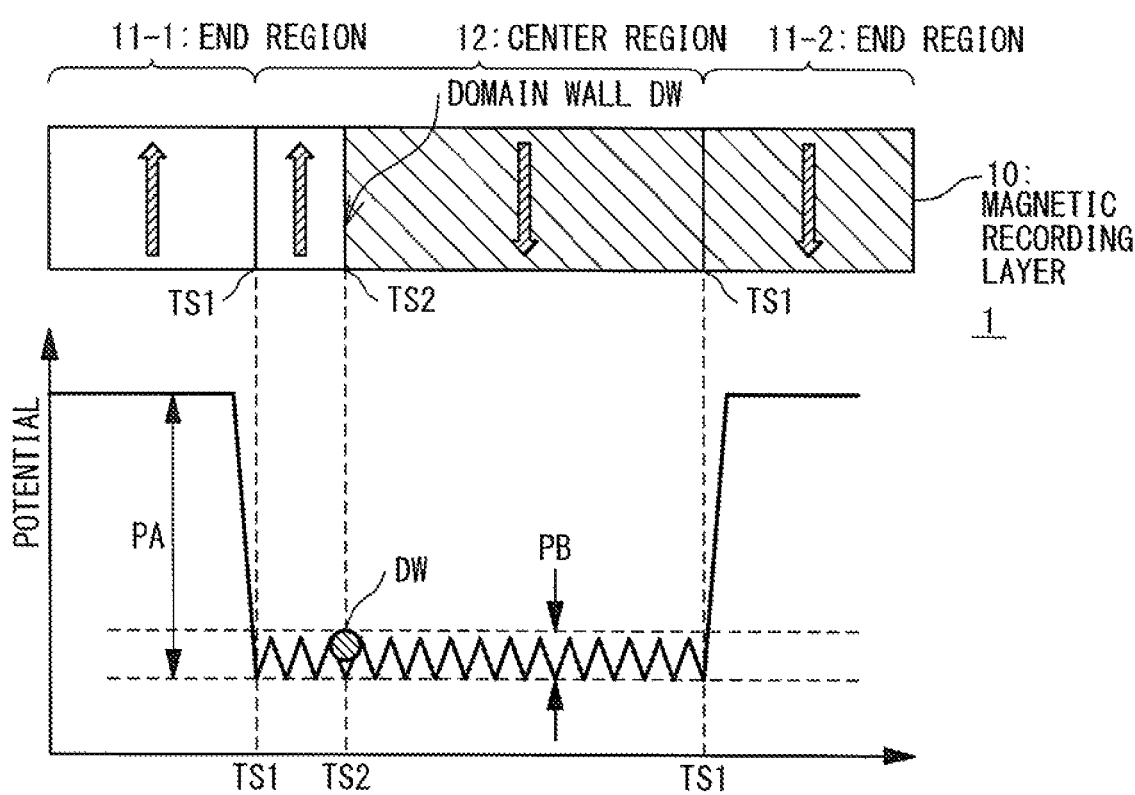
FIG. 1 is a conceptual diagram showing principle of a domain wall motion element according to an exemplary embodiment of the present invention.

FIG. 1 is a conceptual diagram for explaining principle of a domain wall motion element 1 according to an exemplary embodiment of the present invention. The domain wall motion element 1 has a magnetic recording layer 10 that is formed of a ferromagnetic film. The magnetic recording layer 10 has a domain wall DW, and the domain wall DW moves in the magnetic recording layer 10.

More specifically, as shown in FIG. 1, the magnetic recording layer 10 includes a pair of end regions 11 (11-1, 11-2) and a center region 12. The end regions 11-1 and 11-2 are connected to both ends of the center region 12, and the center region 12 is sandwiched between the end regions 11-1 and 11-2. Respective magnetization directions of the end regions 11-1 and 11-2 are fixed in opposite directions to each other. On the other hand, magnetization in the center region 12 is reversible and can be parallel to the magnetization direction of the end region 11-1 or the magnetization direction of the end region 11-2. Therefore, a domain wall DW is formed within the magnetic recording layer 10. The domain wall DW can move in the center region 12 sandwiched between the end regions 11-1 and 11-2 whose magnetization directions are fixed.

In FIG. 1, a potential distribution that the domain wall DW feels in the magnetic recording layer 10 also is shown. The domain wall DW remains more stably at a position with lower potential, under a condition where no external force acts thereon. In other words, the domain wall DW can be trapped at a position where a potential difference exists, under the condition where no external force acts thereon. Such a position at which the domain wall DW can be trapped is hereinafter referred to as a "trapping site". According to the present exemplary embodiment, at least two kinds of trapping site are formed in the magnetic recording layer 10.

As shown in the potential distribution in FIG. 1, the potential in the end regions 11-1 and 11-2 is much higher than the potential in the center region 12. Therefore, a first potential difference PA that is comparatively large exists at a boundary between the center region 12 and each of the end regions 11-1 and 11-2. A "first trapping site TS1" is formed by the comparatively large first potential difference PA. That is, the first trapping site TS1 by which the domain wall DW is trapped is formed at the boundary between the center region 12 and each of the end regions 11-1 and 11-2. Furthermore, a second potential difference PB that is comparatively small exists within the center region 12. A "second trapping site TS2" that is different from the first trapping site TS1 is formed by the comparatively small second potential difference PB. That is, the second trapping site TS2 by which the domain wall DW is trapped is formed within the center region 12. The number of the second trapping site TS2 in the center region 12 can be one or plural. At least one second trapping site TS2 just needs to be formed within the center region 12.

The domain wall DW exists between the end regions 11-1 and 11-2 whose potentials are high. The domain wall DW is trapped by any of the trapping sites (TS1, TS2) included between the end regions 11-1 and 11-2, under a condition that no external force acts thereon. It should be particularly noted that the domain wall. DW can be trapped by the second trapping site TS2. This means that the domain wall DW can remain at a given position within the center region 12.

It is preferable that the first potential difference PA for trapping the domain wall DW at the first trapping site TS1 is larger than the second potential difference PB for trapping the domain wall DW at the second trapping site TS2. That is, it is preferable that the first trapping site TS1 is "stronger" than the second trapping site TS2. The domain wall DW is trapped more stably at the first trapping site TS1 than at the second trapping site TS2.

Various means are possible for forming the first trapping site TS1 (first potential difference PA). For example, the first trapping site TS1 can be formed by a difference in a shape (such as a film thickness and a width) or a difference in magnetic characteristics (such as saturation magnetization and magnetic anisotropy) between each end region 11 and the center region 12.

Also, various means are possible for forming the second trapping site TS2 (second potential difference PB). For example, as shown in a plan view of FIG. 2, convexoconcave 13 formed on a lateral face of the center region 12, namely, in-plane convexoconcave 13 of the center region 12 serves as the second trapping site TS2. Alternatively, as shown in a plan view of FIG. 3, convexoconcave 14 formed on a surface of the center region 12, namely, convexoconcave 14 in a film thickness direction of the center region 12 serves as the second trapping site TS2. Alternatively, as shown in FIG. 4, crystal grain boundary 15 in the ferromagnetic film forming the center region 12 serves as the second trapping site TS2.

A memory data of the domain wall motion element 1 varies depending on magnetization state of the center region 12 of the magnetic recording layer 10, namely, the position of the domain wall DW. In order to write a desired data to the domain wall motion element 1, the domain wall DW in the magnetic recording layer 10 just needs to be moved to a position corresponding to the desired data. The domain wall motion is achieved by the spin momentum transfer. More specifically, the domain wall DW is transferred by supplying the spin polarized current in the in-plane direction of the magnetic recording layer 10.

Figure 5:
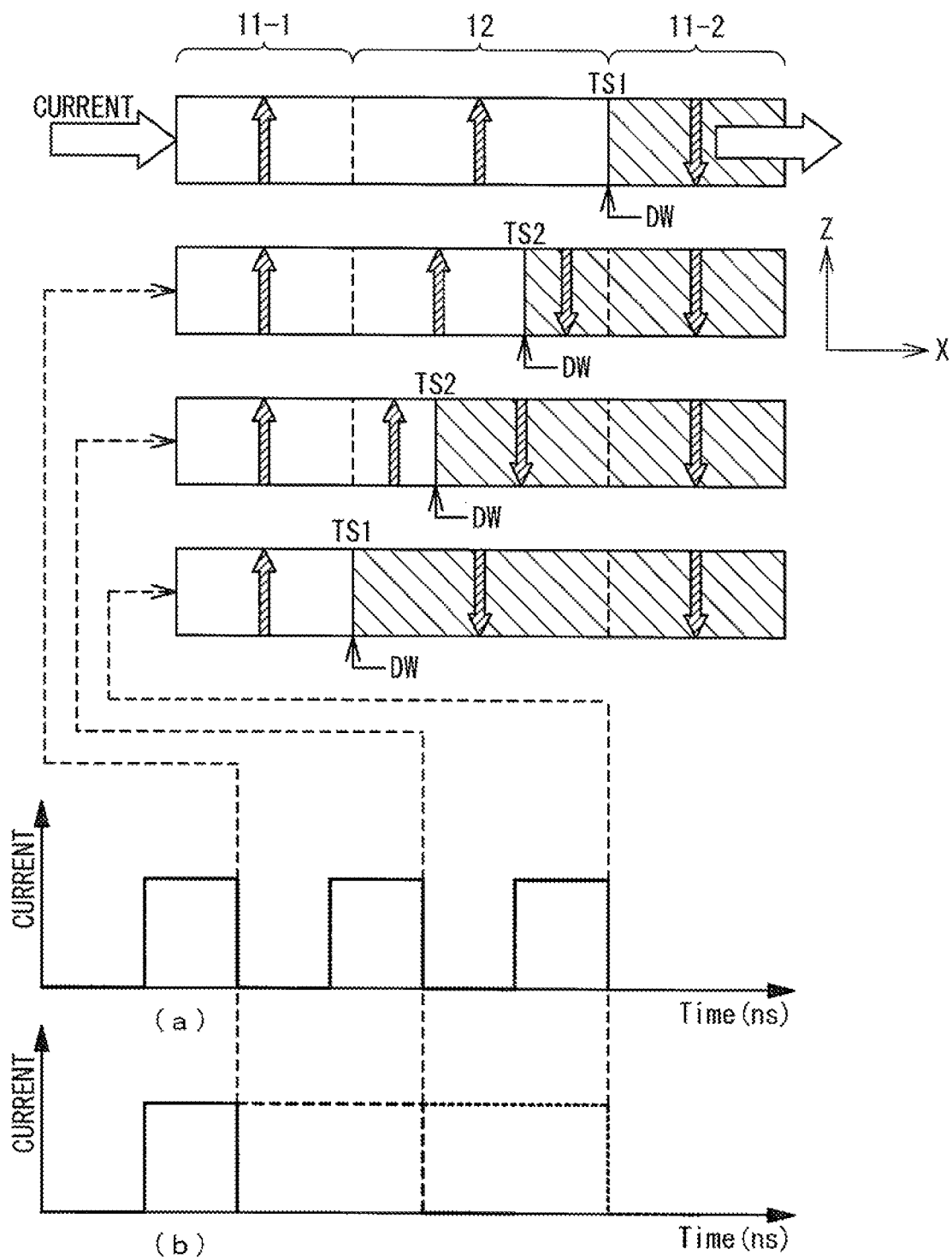
FIG. 5 is a conceptual diagram showing data writing to the domain wall motion element according to the present exemplary embodiment.

FIG. 5 is a conceptual diagram showing data writing to the domain wall motion element 1 according to the present exemplary embodiment. Let us consider a case where the domain wall DW is first positioned at the first trapping site TS1 on the side of the end region 11-2 and then a write current is supplied from the end region 11-1 to the end region 11-2 through the center region 12, as shown in FIG. 5. In this case, spin electrons of the write current move from the end region 11-2 to the center region 12. In accordance with the moving direction of the spin electrons, the domain wall DW moves from the first trapping site TS1 on the side of the end region 11-2 in a direction toward the first trapping site TS1 on the side of the end region 11-1.

Here, the movement distance of the domain wall DW can be variable controlled by adjusting the number of pulses or a pulse width of the write current. The reason is that at least one second trapping site TS2 is formed within the center region 12. In a case where the number of pulses or the pulse width of the write current is small, the domain wall DW does not reach to the first trapping site TS1 on the side of the end region 11-1 and is trapped by the second trapping site TS2 within the center region 12. For example, when one short current pulse is injected, the domain wall DW moves from the first trapping site TS1 on the side of the end region 11-2 to an adjacent second trapping site TS2. When another current pulse is further injected, the domain wall DW moves to the further adjacent second trapping site TS2. By repeating this procedure, the domain wall DW eventually reaches to the first trapping site TS1 on the side of the end region 11-1. In this manner, the movement distance of the domain wall DW varies depending on the number of pulses of the write current. The same applies to the case of the pulse width of the write current. The movement distance of the domain wall DW varies depending on the pulse width of the write current. By appropriately setting the number of pulses or the pulse width of the write current, it is possible to transfer the domain wall DW not only to the first trapping site TS1 but also to the second trapping site TS2 within the center region 12. That is, it is possible to have the domain wall DW stop at a predetermined position within the center region 12.

The same applies to a case of moving the domain wall DW in the opposite direction. In this case, the write current is supplied from the end region 11-2 to the end region 11-1 through the center region 12. Therefore, spin electrons of the write current move from the end region 11-1 to the center region 12. In accordance with the moving direction of the spin electrons, the domain wall DW moves in a direction toward the side of the end region 11-2. Also in this case, by appropriately setting the number of pulses or the pulse width of the write current, it is possible to transfer the domain wall DW not only to the first trapping site TS1 but also to the second trapping site TS2 within the center region 12.

As described above, the moving direction of the domain wall DW can be set based on the direction of the write current. Moreover, the movement distance of the domain wall DW can be set based on the number of pulses or the pulse width of the write current. Thus, it is possible to transfer the domain wall to a desired position (first trapping site TS1 or second trapping site TS2) in the magnetic recording layer 10.

The memory data of the domain wall motion element 1 can be read out by utilizing a magnetoresistance element. The magnetoresistance element is configured such that a resistance value thereof varies depending on the magnetization state (position of the domain wall DW) of the center region 12 of the magnetic recording layer 10. It is therefore possible to sense the magnetization state of the center region 12, namely, the memory data of the domain wall motion element 1 by detecting the resistance value of the magnetoresistance element. It can be said that the magnetic recording layer 10 constitutes a data write unit, while the magnetoresistance element constitutes a data read unit. Typically, a magnetic tunnel junction (MTJ) element is used as the magnetoresistance element.

Figure 6:
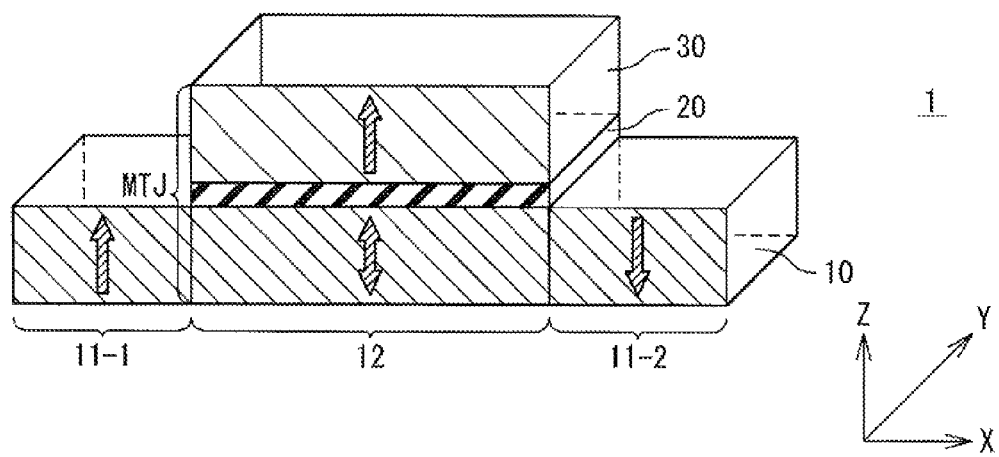
FIG. 6 shows an example of a data read unit in the domain wall motion element according to the present exemplary embodiment.

FIG. 6 shows an example of the data read unit (MTJ). In the example shown in FIG. 6, the domain wall motion element 1 has a tunnel barrier layer 20 being a nonmagnetic layer and a magnetization fixed layer 30 being a ferromagnetic layer, in addition to the magnetic recording layer 10. The tunnel barrier layer 20 is an insulating layer and is sandwiched between at least the center region 12 of the magnetic recording layer 10 and the magnetization fixed layer 30. The magnetization fixed layer 30 faces at least the center region 12 of the magnetic recording layer 10 across the tunnel barrier layer 20. The center region 12 of the magnetic recording layer 10, the tunnel barrier layer 20 and the magnetization fixed layer 30 form the MTJ.

A magnetization direction of the magnetization fixed layer 30 is fixed in one direction. On the other hand, the magnetization at each position in the center region 12 is parallel to or anti-parallel to the magnetization direction of the magnetization fixed layer 30. Therefore, the resistance value of the MTJ varies depending on a relative angle between the magnetization direction of the magnetization fixed layer 30 and an average magnetization direction of the center region 12. That is, the resistance value of the MTJ varies depending on the magnetization state (position of the domain wall DW) of the center region 12 of the magnetic recording layer 10. At a time of data reading, a read current is so supplied in a perpendicular-to-plane direction as to pass through the MTJ. Based on the read current, it is possible to sense the resistance value of the MTJ, namely, the memory data.

Figure 7:
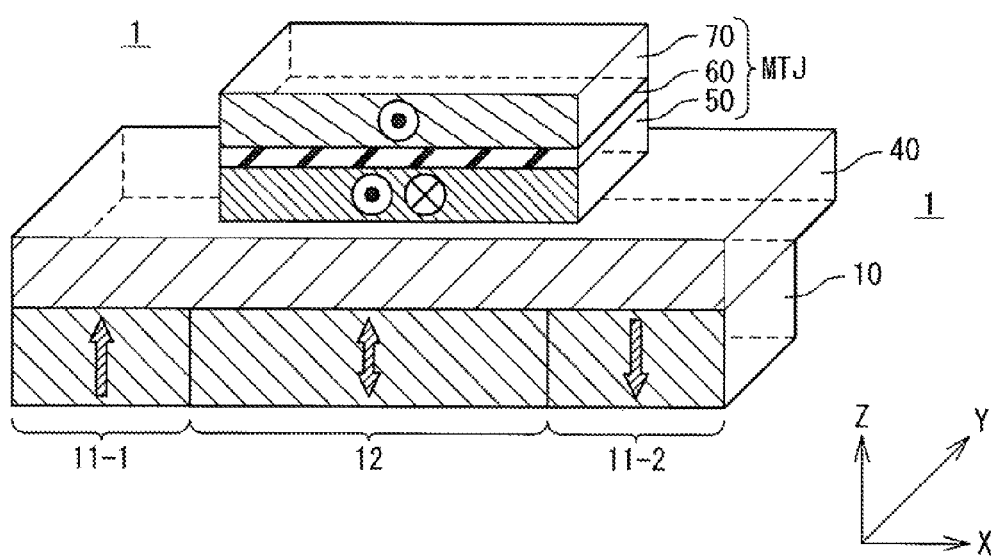
FIG. 7 shows another example of a data read unit in the domain wall motion element according to the present exemplary embodiment.

FIG. 7 shows another example of the data read unit (MTJ). In the example shown in FIG. 7, the domain wall motion element 1 has a conductive layer 40, a magnetization free layer 50 being a ferromagnetic layer, a tunnel barrier layer 60 being a nonmagnetic layer and a magnetization fixed layer 70 being a ferromagnetic layer, in addition to the magnetic recording layer 10. The tunnel barrier layer 60 is an insulating layer and is sandwiched between the magnetization free layer 50 and the magnetization fixed layer 70. The magnetization free layer 50, the tunnel barrier layer 60 and the magnetization fixed layer 70 form the MTJ. The conductive layer 40 is sandwiched between the magnetic recording layer 10 and the MTJ. It should be noted that the conductive layer 40 may be a nonmagnetic layer or may not be provided.

Moreover, a magnetization direction of the magnetization fixed layer 70 of the MTJ is fixed in one direction. Whereas, the magnetization free layer 50 of the MTJ is magnetically coupled to the center region 12 of the magnetic recording layer 10. A magnetization state of the magnetization free layer 50 varies depending on the magnetization state of the center region 12 of the magnetic recording layer 10.

For example, as shown in FIG. 7, the magnetic recording layer 10 is formed of a perpendicular magnetic film having perpendicular magnetic anisotropy, while the magnetization free layer 50 and the magnetization fixed layer 70 each is formed of an in-plane magnetic film having in-plane magnetic anisotropy. The magnetization direction at each position in the center region 12 of the magnetic recording layer 10 is the +Z direction or the −Z direction. The magnetization direction of the magnetization fixed layer 70 is fixed in the in-plane −Y direction. The magnetization free layer 50 and the center region 12 of the magnetic recording layer 10 are magnetically coupled to each other. Moreover, in the XY plane, a center of the magnetization free layer 50 is displaced in the Y direction from a center of the center region 12. As a result, leakage magnetic flux from the perpendicular magnetization at each position in the center region 12 applies a magnetic component in the +Y direction or the −Y direction to the magnetization free layer 50. The magnetization direction at each position in the magnetization free layer 50 is uniquely determined depending on the magnetization direction at each position in the center region 12. That is to say, the magnetization state of the magnetization free layer 50 varies depending on the magnetization state of the center region 12.

In the example shown in FIG. 7, the resistance value of the MTJ varies depending on a relative angle between the magnetization direction of the magnetization fixed layer 70 and an average magnetization direction of the magnetization free layer 50. As mentioned above, the magnetization state of the magnetization free layer 50 depends on the magnetization state of the center region 12. Therefore, it can be said that the resistance value of the MTJ varies depending on the magnetization state (position of the domain wall DW) of the center region 12. At the time of data reading, a read current is so supplied in the perpendicular-to-plane direction as to pass through the MTJ. Based on the read current, it is possible to sense the resistance value of the MTJ, namely, the memory data.

Figure 8:
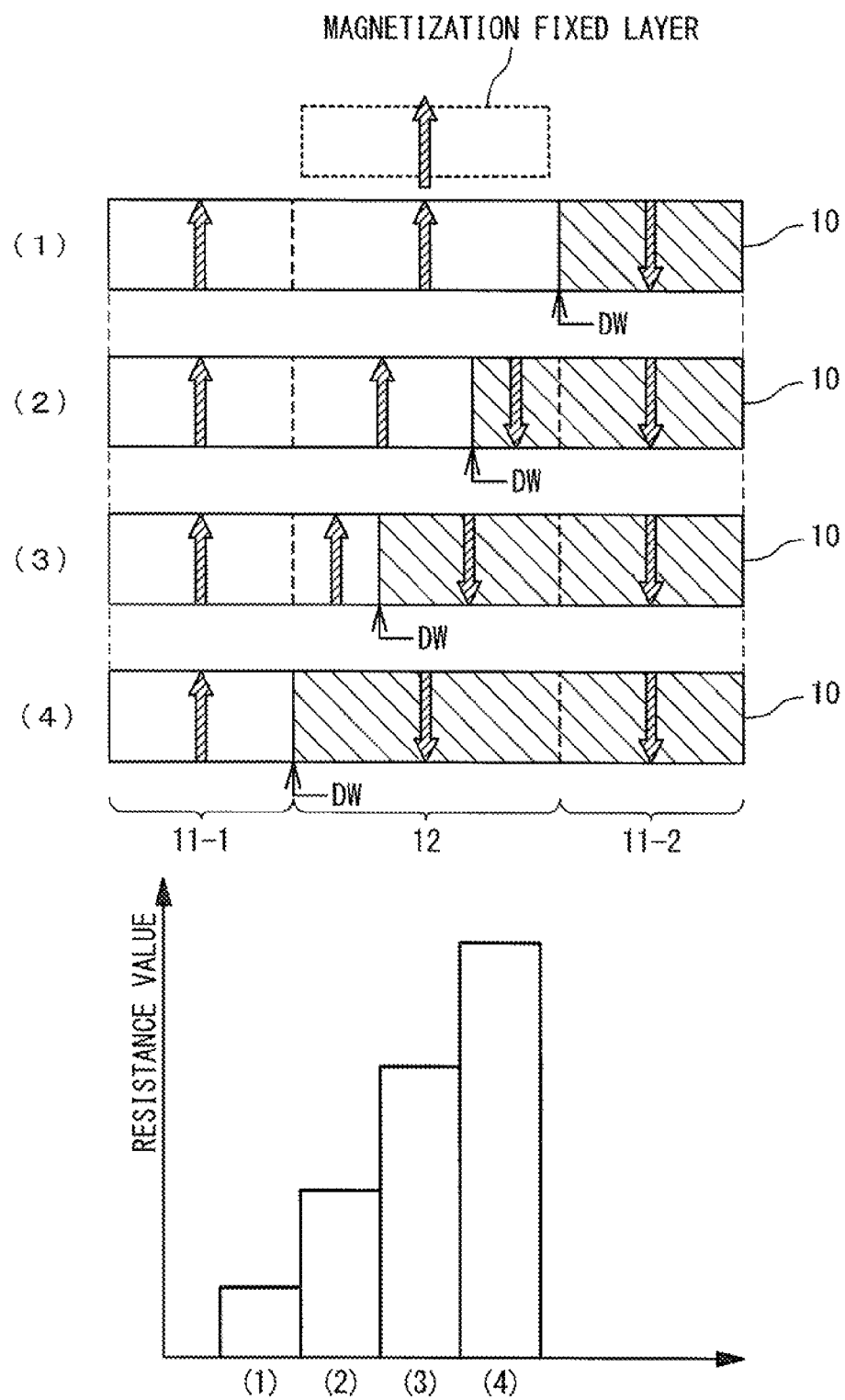
FIG. 8 is a conceptual diagram showing an example of resistance values that the domain wall motion element according to the present exemplary embodiment can take.

FIG. 8 conceptually shows an example of resistance values that the domain wall motion element 1 according to the present exemplary embodiment can take. As explained in the foregoing FIG. 5, the domain wall DW can be trapped not only by the first trapping site TS1 at the end of the center region 12 but also by the second trapping site TS2 within the center region 12. It can be seen that the resistance value of the MTJ varies variously depending on the position of the domain wall DW, namely, the magnetization state of the center region 12. In the example shown in FIG. 8, four kinds of resistance state (1) to (4) different from each other can be obtained. That is, the domain wall motion element 1 capable of storing multivalued data is achieved. The domain wall motion element 1 according to the present exemplary embodiment is capable of a multivalued operation.

To generalize, according to the domain wall motion element 1 of the present exemplary embodiment, at least three trapping sites are formed in the magnetic recording layer 10 in which the domain wall moves. By transferring the domain wall DW among the trapping sites, the multivalued operation can be achieved.

Figure 9:
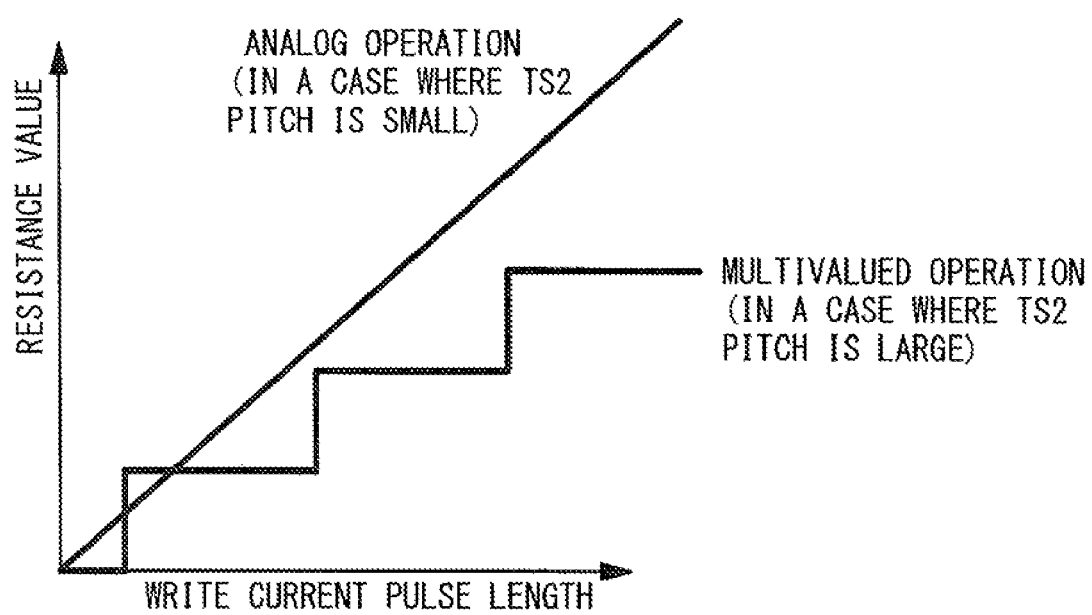
FIG. 9 is a graph showing variation in a resistance value of the domain wall motion element according to the present exemplary embodiment.

FIG. 9 conceptually shows variation in the resistance value of the domain wall motion element 1 according to the present exemplary embodiment. A vertical axis represents the resistance value, and a horizontal axis represents the pulse length of the write current. Alternatively, the horizontal axis may be the number of pulses. As described above, it is possible to transfer the domain wall DW to a desired trapping site to achieve a desired resistance value (memory data), by controlling the pulse length (or the number of pulses) of the write current. Here, the resistance values that the domain wall motion element 1 can take depend on the number of the second trapping sites TS2 within the center region 12. In a case where the number of the second trapping sites TS is small and a pitch of the second trapping sites TS2 is large, the resistance value varies in a stepwise manner. As the number of the second trapping sites TS2 increases and the pitch of the second trapping, sites TS becomes smaller, variation in the resistance value becomes finer. When a large number of second trapping sites TS2 are provided, the resistance value varies continuously (smoothly) and the domain wall motion element 1 behaves in an analog manner.

According to the present exemplary embodiment, as described above, the domain wall motion element 1 that is capable of the multivalued operation and further an analog operation can be achieved. By applying the domain wall motion element 1 to an MRAM, a domain wall motion type MRAM that is capable of the multivalued operation and further the analog operation can be achieved.

2. Examples of Domain Wall Motion Element

Examples of the domain wall motion element (domain wall motion type magnetoresistance element) 1 according to the present exemplary embodiment will be described below in more detail.

2-1. First Example

Figure 10:
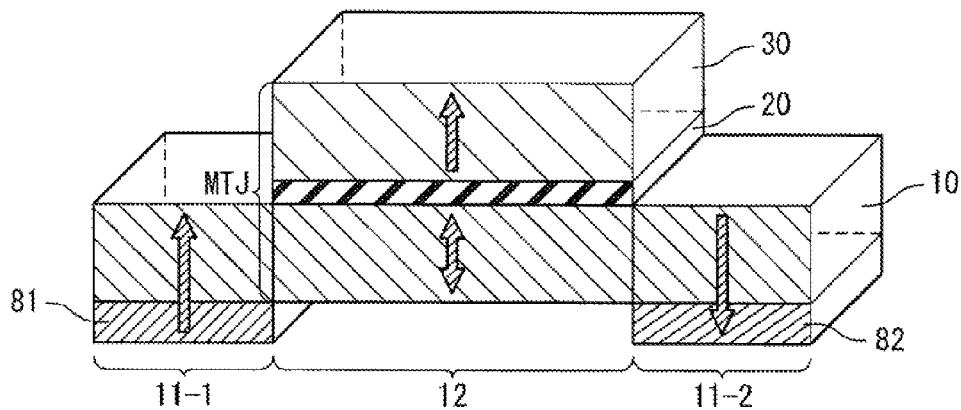
FIG. 10 shows an example of the domain wall motion element according to the present exemplary embodiment.
Figure 10:
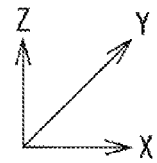

FIG. 10 shows an example of the domain wall motion element 1 according to the present exemplary embodiment. The domain wall motion element 1 shown in FIG. 10 has a structure similar to that shown in the foregoing FIG. 6, and provided with the magnetic recording layer 10, the tunnel barrier layer 20 and the magnetization fixed layer 30. The center region 12 of the magnetic recording layer 10, the tunnel barrier layer 20 and the magnetization fixed layer 30 form the read unit (MTJ).

In the present example, the magnetic recording layer 10 and the magnetization fixed layer 30 each is formed of a perpendicular magnetic film having the perpendicular magnetic anisotropy. The magnetization direction of the magnetization fixed layer 30 is fixed, for example, in the +Z direction. The magnetization direction of the center region 12 of the magnetic recording layer 10 becomes parallel to or antiparallel to the magnetization direction of the magnetization fixed layer 30. The magnetization directions of the end regions 11-1 and 11-2 of the magnetic recording layer 10 are fixed in the opposite directions to each other along the Z axis.

The magnetic recording layer 10 is exemplified by a CoPt alloy film, a CoCrPt alloy film, a CoPd alloy film, a CoSm alloy film, a Co/Pt laminated film, a Co/Pd laminated film, a FePt alloy film, a FePd alloy film, a Fe/Pt laminated film, a Fe/Pd laminated film, a TbFeCo alloy film, a GdFeCo alloy film and so forth. The tunnel barrier layer 20 is exemplified by a Al—O film, a MgO film and so forth. The magnetization fixed layer 30 is exemplified by a CoPt alloy film, a CoCrPt alloy film, a CoPd alloy film, a CoSm alloy film, a Co/Pt laminated film, a Co/Pd laminated film, a FePt alloy film, a FePd alloy film, a Fe/Pt laminated film, a Fe/Pd laminated film, a TbFeCo alloy film, a GdFeCo alloy film and so forth.

In FIG. 10, a first magnetic film 81 and a second magnetic film 82 are so stacked as to be adjacent to the respective end regions 11-1 and 11-2, in order to form the first trapping site TS1 at the boundary between each end region 11 and the center region 12. Saturation magnetization or crystal magnetic anisotropy of the first magnetic film 81 and the second magnetic film 82 is different from that of the magnetic film forming the magnetic recording layer 10. Among a CoPt alloy film, a CoCrPt alloy film, a CoPd alloy film, a CoSm alloy film, a Co/Pt laminated film, a Co/Pd laminated film, a FePt alloy film, a FePd alloy film, a Fe/Pt laminated film, a Fe/Pd laminated film, a TbFeCo alloy film, a GdFeCo alloy film and so force, a film whose saturation magnetization or crystal magnetic anisotropy is different from that of the magnetic, recording layer 10 can be used as the first magnetic film 81 and the second magnetic film 82. Due to the difference in the magnetic characteristics (saturation magnetization, magnetic anisotropy), the first trapping site TS1 is formed at the boundary between the each end region 11 and the center region 12.

Figure 11:
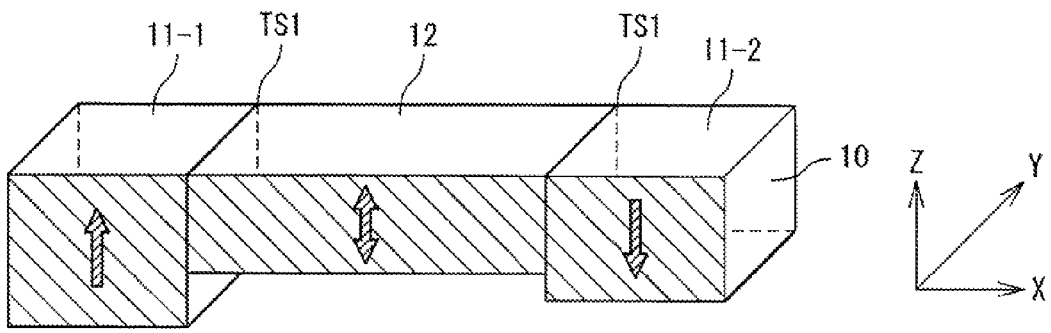
FIG. 11 shows an example of a magnetic recording layer of the domain wall motion element according to the present exemplary embodiment.
Figure 12:
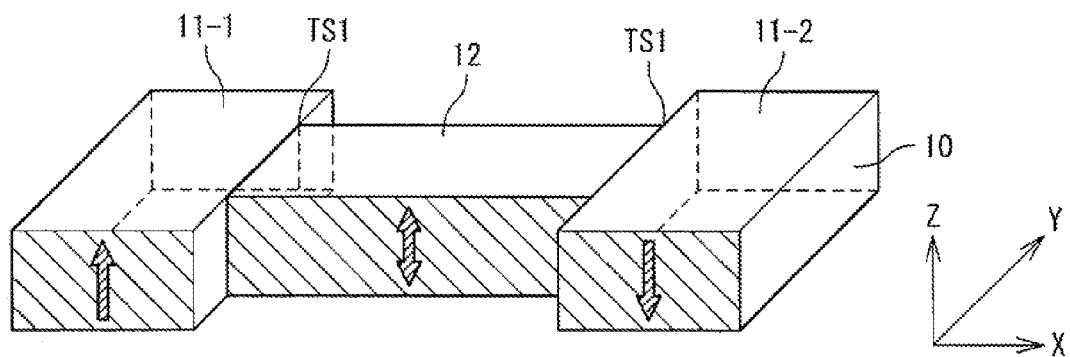
FIG. 12 shows another example of the magnetic recording layer of the domain wall motion element according to the present exemplary embodiment.

As shown in FIG. 11 and FIG. 12, the first trapping site TS1 can also be formed by a difference in a shape (film thickness, width) between the each end region 11 and the center region 12. Due to a step difference (film thickness difference, width difference) between the each end region 11 and the center region 12, the first potential difference PA as shown in FIG. 1 is caused and the first trapping site TS1 is formed. In FIG. 11, the each end region 11 is formed such that the film thickness thereof is larger than that of the center region 12. In this case, the film thickness of the magnetic recording layer 10 at the first trapping site TS1 is larger on the side of the end region 11 than on the side of the center region 12. In FIG. 12, the each end region 11 is formed such that an in-plane width (width in the XY plane) thereof is larger than that of the center region 12. In this case, the in-plane width of the magnetic recording layer 10 at the first trapping site TS1 is larger on the side of the end region 11 than on the side of the center region 12.

Figure 2:
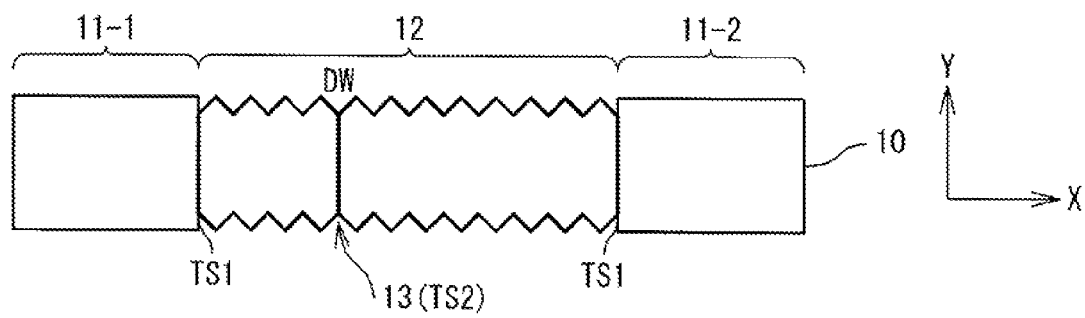
FIG. 2 is a plan view showing an example of a center region of the domain wall motion element according to the present exemplary embodiment.
Figure 3:
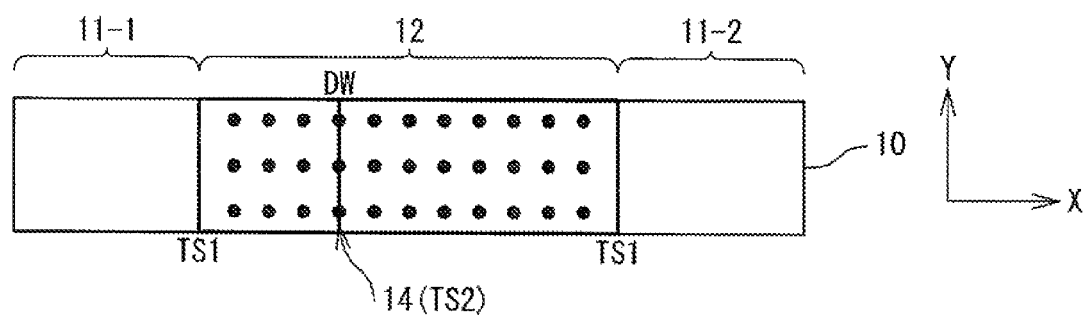
FIG. 3 is a plan view showing another example of the center region of the domain wall motion element according to the present exemplary embodiment.
Figure 4:
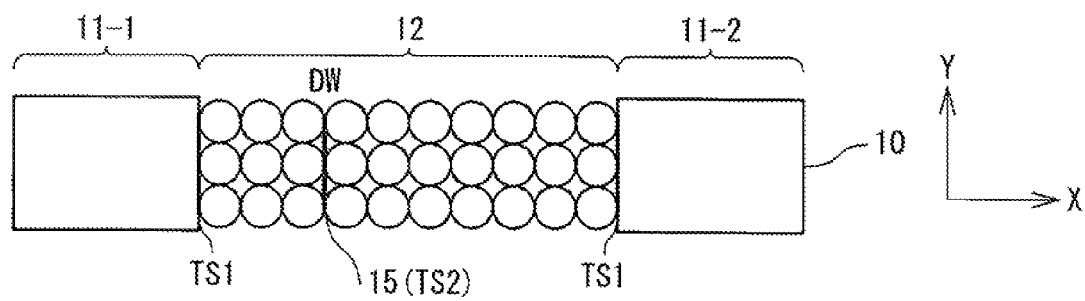
FIG. 4 is a plan view showing still another example of the center region of the domain wall motion element according to the present exemplary embodiment.

A means for forming the second trapping site TS2 within the center region 12 can be any of those explained in the foregoing FIGS. 2 to 4. In the example shown in FIG. 2, the convexoconcave 13 formed on a lateral face of the center region 12, namely, the in-plane convexoconcave 13 of the center region 12 serves as the second trapping site TS2. The convexoconcave 13 can be formed by using a mask that has a pattern corresponding to the convexoconcave 13, when patterning of the magnetic recording layer 10 is performed. In the example shown in FIG. 3, the convexoconcave 14 formed on a surface of the center region 12, namely, the convexoconcave 14 in the film thickness direction of the center region 12 serves as the second trapping site TS2. The convexoconcave 14 can be formed by processing the film surface of the center region 12 by an ion beam etching method or the like. In the example shown in FIG. 4, a crystalline magnetic film is used and the crystal grain boundary 15 in the magnetic film serves as the second trapping site TS2. As the crystalline magnetic film, a CoPt alloy film, a CoCrPt alloy film, a CoPd alloy film, a CoSm alloy film, a Co/Pt laminated film, a Co/Pd laminated film, a FePt alloy film, a FePd alloy film, a Fe/Pt laminated film, a Fe/Pd laminated film can be used.

2-2. Second Example

Figure 13:
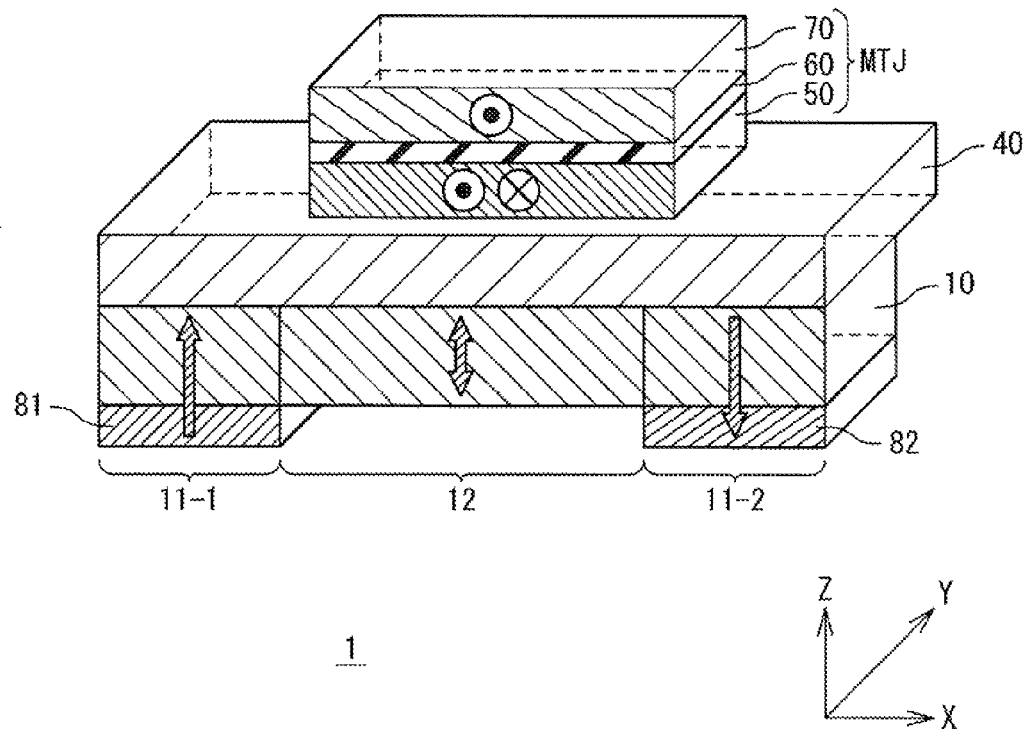
FIG. 13 shows another example of the domain wall motion element according to the present exemplary embodiment.

FIG. 13 shows another example of the domain wall motion element 1 according to the present exemplary embodiment. The domain wall motion element 1 shown in FIG. 13 has a structure similar to that shown in the foregoing FIG. 7, and is provided with the magnetic recording layer 10, the conductive layer 40, the magnetization free layer 50, the tunnel barrier layer 60 and the magnetization fixed layer 70. The magnetization free layer 50, the tunnel barrier layer 60 and the magnetization fixed layer 70 form the read unit (MTJ).

The magnetic recording layer 10 is the same as in the case of the above-described first example, and an overlapping description will be omitted. In the present example, the magnetization free layer 50 and the magnetization fixed layer 70 each is formed of an in-plane magnetic film having in-plane magnetic anisotropy. The magnetization direction of the magnetization fixed layer 70 is fixed, for example, in the −Y direction. The magnetization free layer 50 is magnetically coupled to the center region 12 of the magnetic recording layer 10, and the magnetization state thereof varies depending on the magnetization state of the center region 12.

As the conductive layer 40, a Ta film and the like can be used. The magnetization free layer 50 is exemplified by a NiFe alloy film, a CoFe alloy film, a CoFeNi alloy film, a CoTaZr alloy film, a CoNbZr alloy film, a CoFeB alloy film and so forth. The tunnel barrier layer 60 is exemplified by an Al—O film, a MgO film and so forth. The magnetization fixed layer 70 is exemplified by a NiFe alloy film, a CoFe alloy film, a CoFeNi alloy film, a CoTaZr alloy film, a CoNbZr alloy film, a CoFeB alloy film and so forth. Alternatively, a laminated film of such an alloy film and an anti-ferromagnetic film (such as a PtMn alloy film and a IrMn alloy film) may be used as the magnetization fixed layer 70.

2-3. Third Example

Figure 14:
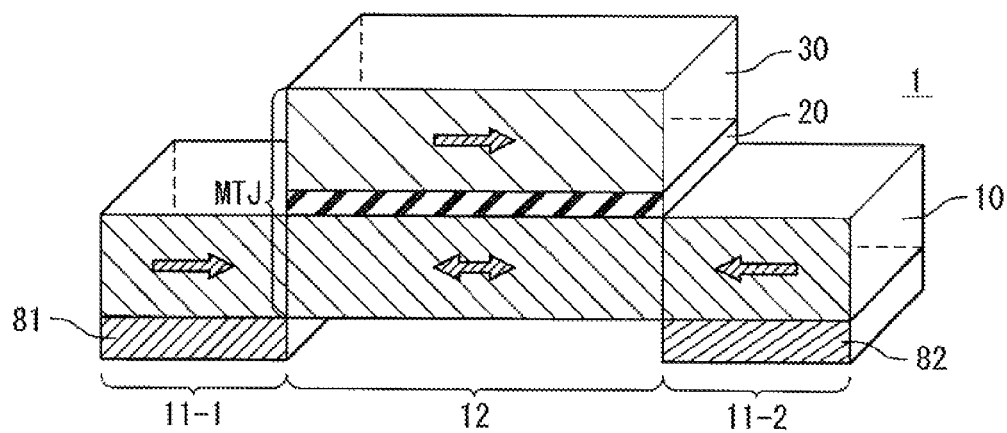
FIG. 14 shows still another example of the domain wall motion element according to the present exemplary embodiment.
Figure 14:
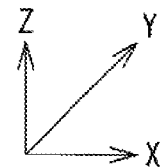

FIG. 14 shows still another example of the domain wall motion element 1 according to the present exemplary embodiment. The domain wall motion element 1 shown in FIG. 14 has a structure similar to that shown in the first example (FIG. 10). However, the magnetic recording layer 10 and the magnetization fixed layer 30 each is formed of an in-plane magnetic film having the in-plane magnetic anisotropy.

The magnetic recording layer 10 is exemplified by a NiFe alloy film, a CoFe alloy film, a CoFeNi alloy film, a CoTaZr alloy film, a CoNbZr alloy film, a CoFeB alloy film and so forth. The tunnel barrier layer 20 is exemplified by an Al—O film, a MgO film and so forth. The magnetization fixed layer 30 is exemplified by a NiFe alloy film, a CoFe alloy film, a CoFeNi alloy film, a CoTaZr alloy film, a CoNbZr alloy film, a CoFeB alloy film and so forth. Alternatively, a laminated film of such an alloy film and an anti-ferromagnetic film (such as a PtMn alloy film and a IrMn alloy film) may be used as the magnetization fixed layer 30.

The magnetization direction of the magnetization fixed layer 30 is fixed, for example, in the +X direction. The magnetization direction of the center region 12 of the magnetic recording layer 10 becomes parallel to or anti-parallel to the magnetization direction of the magnetization fixed layer 30. The magnetization directions of the end regions 11-1 and 11-2 of the magnetic recording layer 10 are fixed in the opposite directions to each other along the X axis. The center region 12 of the magnetic recording layer 10, the tunnel barrier layer 20 and the magnetization fixed layer 30 form the read unit (MTJ).

In FIG. 14, a first magnetic film 81 and a second magnetic film 82 are so stacked as to be adjacent to the respective end regions 11-1 and 11-2, in order to form the first trapping site TS1 at the boundary between each end region 11 and the center region 12. Saturation magnetization or crystal magnetic anisotropy of the first magnetic film 81 and the second magnetic film 82 is different from that of the magnetic film forming the magnetic recording layer 10. A CoPt alloy film, a CoCrPt alloy film, a CoCrTa alloy film, a CoPd alloy film, a PtMn alloy film, a IrMn alloy film and so forth can be used as the first magnetic film 81 and the second magnetic film 82.

Figure 15:
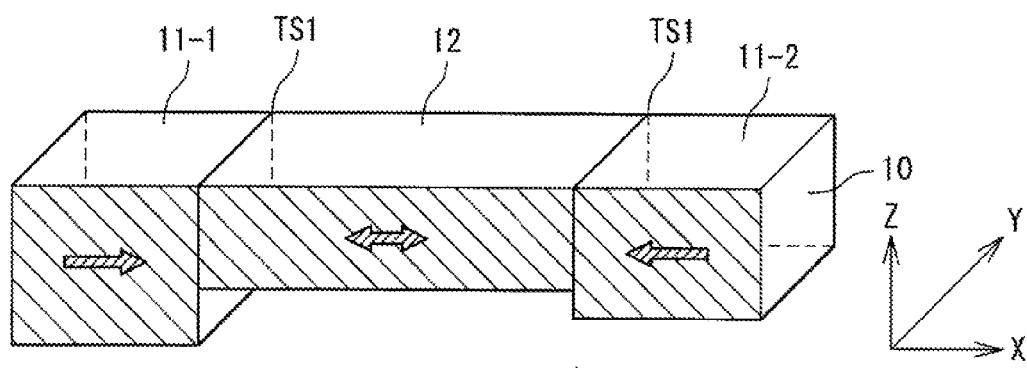
FIG. 15 shows an example of the magnetic recording layer of the domain wall motion element according to the present exemplary embodiment.
Figure 16:
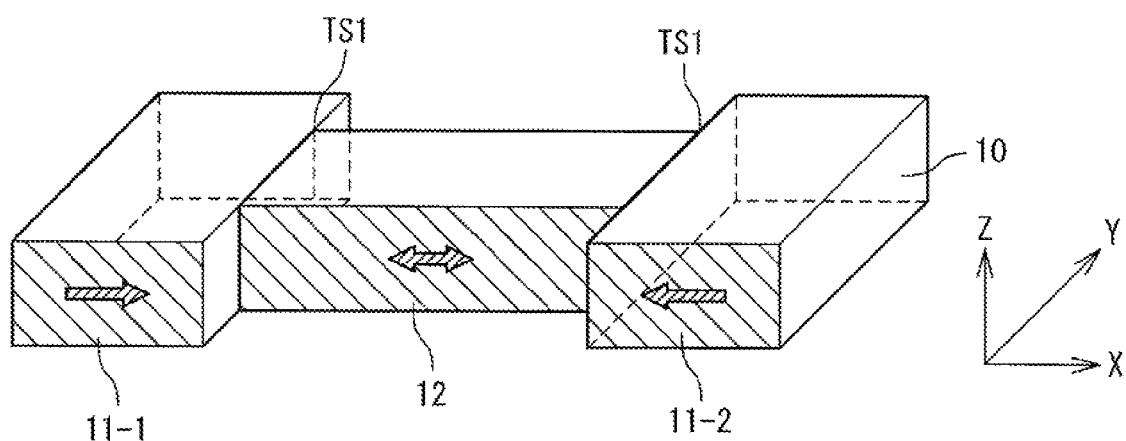
FIG. 16 shows another example of the magnetic recording layer of the domain wall motion element according to the present exemplary embodiment.

As shown in FIG. 15 and FIG. 16, the first trapping site TS1 can also be formed by a difference in a shape (film thickness, width) between the each end region 11 and the center region 12. Due to a step difference (film thickness difference, width difference) between the each end region 11 and the center region 12, the first potential difference PA as shown in FIG. 1 is caused and the first trapping site TS1 is formed. In FIG. 15, the each end region 11 is formed such that the film thickness thereof is larger than that of the center region 12. In this case, the film thickness of the magnetic recording layer 10 at the first trapping site TS1 is larger on the side of the end region 11 than on the side of the center region 12. In FIG. 16, the each end region 11 is formed such that an in-plane width (width in the XY plane) thereof is larger than that of the center region 12. In this case, the in-plane width of the magnetic recording layer 10 at the first trapping site TS1 is larger on the side of the end region 11 than on the side of the center region 12.

A means for forming the second trapping site TS2 within the center region 12 can be any of those explained in the foregoing FIGS. 2 to 4. In the example shown in FIG. 2, the convexoconcave 13 formed on a lateral face of the center region 12, namely, the in-plane convexoconcave 13 of the center region 12 serves as the second trapping site TS2. The convexoconcave 13 can be formed by using a mask that has a pattern corresponding to the convexoconcave 13, when patterning of the magnetic recording layer 10 is performed. In the example shown in FIG. 3, the convexoconcave 14 formed on a surface of the center region 12, namely, the convexoconcave 14 in the film thickness direction of the center region 12 serves as the second trapping site TS2. The convexoconcave 14 can be formed by processing the film surface of the center region 12 by an ion beam etching method or the like. In the example shown in FIG. 4, a crystalline magnetic film is used and the crystal grain boundary 15 in the magnetic film serves as the second trapping site TS2. As the crystalline magnetic film, a NiFe alloy film, a CoFe alloy film and a CoFeNi alloy film can be used.

In either example, the multivalued operation and further the analog operation are possible (refer to FIG. 5, FIG. 8 and FIG. 9).

3. MRAM

Figure 17:
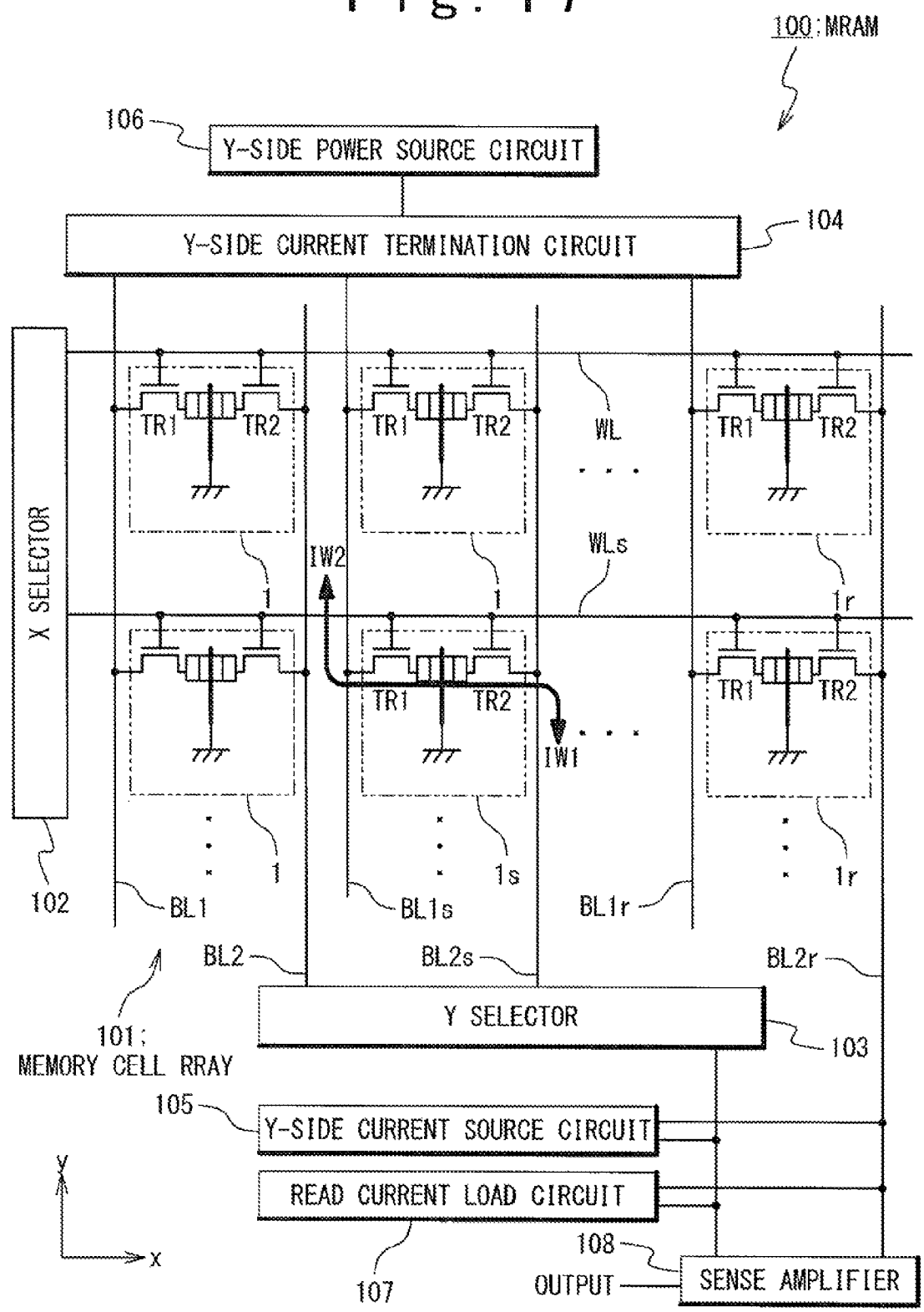
FIG. 17 is a circuit block diagram showing a configuration of an MRAM that uses the domain wall motion element according to the present exemplary embodiment.

A domain wall motion type MRAM according to the present exemplary embodiment uses the above-described domain wall motion element 1 as a memory cell and is capable of the multivalued operation. FIG. 17 shows an example of a configuration of an MRAM 100 according to the present exemplary embodiment. FIG. 18 briefly shows data writing/reading with respect to the MRAM 100 shown in FIG. 17.

The MRAM 100 has a memory cell array 101 in which a plurality of magnetic memory cells (domain wall motion elements) 1 are arranged in an array form. The memory cell array 101 includes not only the memory cells 1 used for data recording but also reference cells 1$r$ which are referred to at the time of data reading. A basic structure of the reference cell 1$r$ is the same as that of the memory cell 1.

Each memory cell 1 (1$r$) is connected to a word line WL and a pair of bit lines BL1 and BL2 (BL1$r$ and BL2$r$). More specifically, the end regions 11-1 and 11-2 of the magnetic recording layer 10 are respectively connected to a first bit line BL1 (BL1$r$) and a second bit line BL2 (BL2$r$) through a first transistor TR1 and a second transistor TR2. Gates of the first transistor TR1 and the second transistor TR2 are connected to the word line WL. Moreover, one end of the MTJ as the data read unit is connected to a ground line.

A plurality of word lines WL are connected to an X selector 102. The X selector 102 selects one word line WL connected to a target memory cell is as a selected word line WLs from the plurality of word lines WL. A potential of the selected word line WLs is set to "High", and the first transistor TR1 and the second transistor TR2 of the target memory cell is are turned ON. A plurality of first bit lines BL1 are connected to a Y-side current termination circuit 104, and a plurality of second bit lines BL2 are connected to a Y selector 103. The Y selector 103 selects one second bit line BL2 connected to the target memory cell is as a selected second bit line BL2$s$ from the plurality of second bit lines BL2. The Y-side current termination circuit 104 selects one first bit line BL1 connected to the target memory cell 1$s$ as a selected first bit line BL1$s$ from the plurality of first bit lines BL1. In this manner, the target memory cell 1$s$ is selected.

A Y-side current source circuit 105 is a current source that supplies or draws a predetermined write current (IW1, IW2) with respect to the selected second bit line BL2$s$. The Y-side current source circuit 105 has a current selector section that determines a direction of the write current and a constant current source that supplies a constant current. A Y-side power source circuit 106 supplies a predetermined voltage to the Y-side current termination circuit 104. As a result, the write current IW1, IW2 by the Y-side current source circuit 105 flows into the Y selector 103 or flows out from the Y selector 103, depending on the data to be written to the target memory cell 1$s$.

For example, in a case of data writing to increase the resistance value of the MTJ, potentials of the first bit line BL1 and the second bit line BL2 are set to "High" and "Low", respectively. As a result, the first write current IW1 flows from the first bit line BL1 to the second bit line BL2 through the first transistor TR1, the magnetic recording layer 10 and the second transistor TR2. On the other hand, in a case of data writing to decrease the resistance value of the MTJ, potentials of the first bit line BL1 and the second bit line BL2 are set to "Low" and "High", respectively. As a result, the second write current IW2 flows from the second bit line BL2 to the first bit line BL1 through the second transistor TR2, the magnetic recording layer 10 and the first transistor TR1. It is possible to write a desired data by controlling the number of pulses or the pulse width of the write current IW1 or IW2.

At the time of data reading, the first bit line BL1 is set to "Open" and a potential of the second bit line BL2 is set to "High", for example. A read current load circuit 107 supplies a predetermined read current to the selected second bit line BL2$s$. The read current flows from the selected second bit line BL2$s$ to the ground line through the second transistor TR2 and the MTJ. Similarly, the read current load circuit 107 supplies the predetermined current to a reference second bit line BL2$r$ which is connected to the reference cell 1$r$. A sense amplifier 108 senses data of the target memory cell 1$s$ based on a difference between a potential of the reference second bit line BL2$r$ and a potential of the selected second bit line BL2$s$, and outputs the data.

The exemplary embodiments of the present invention have been described above with reference to the attached drawings. However, the present invention is not limited to the above-described exemplary embodiments and can be appropriately modified by a person skilled in the art without departing from the scope of the invention.

The invention claimed is:

1. A domain wall motion element comprising a magnetic recording layer that is formed of a ferromagnetic film and has a domain wall,
   wherein said magnetic recording layer comprises:
   a pair of end regions whose magnetization directions are fixed; and
   a center region sandwiched between said pair of end regions, in which said domain wall moves,
   wherein a first trapping site by which said domain wall is trapped is formed at a boundary between said end region and said center region,
   at least one second trapping site by which said domain wall is trapped is formed within said center region,
   a potential difference for trapping said domain wall at said first trapping site is a first potential difference, and
   a potential difference for trapping said domain wall at said second trapping site is a second potential difference that is smaller than said first potential difference.

2. The domain wall motion element according to claim 1, wherein a number of said second trapping site within said center region is plural.

3. The domain wall motion element according to claim 1, wherein said second trapping site is convexoconcave formed on a lateral face of said center region.

4. The domain wall motion element according to claim 1, wherein said second trapping site is convexoconcave formed on a surface of said center region.

5. The domain wall motion element according to claim 1, wherein said second trapping site is a crystal grain boundary in said ferromagnetic film in said center region.

6. The domain wall motion element according to claim 1, wherein a film thickness of said magnetic recording layer at said first trapping site is larger on a side of said end region than on a side of said center region.

7. The domain wall motion element according to claim 1, wherein an in-plane width of said magnetic recording layer at said first trapping site is larger on a side of said end region than on a side of said center region.

8. The domain wall motion element according to claim 1, further comprising: a first magnetic film and a second magnetic film that are respectively adjacent to said pair of end regions,
   wherein saturation magnetization or crystal magnetic anisotropy of said first magnetic film and said second magnetic film is different from that of said magnetic recording layer.

9. The domain wall motion element according to claim 1, wherein flow of a current between said pair of end regions causes said domain wall to move to any of said at least one second trapping site or said first trapping site.

10. The domain wall motion element according to claim 9, wherein a movement distance of said domain wall varies depending on a number of pulses of said current.

11. The domain wall motion element according to claim 9, wherein a movement distance of said domain wall varies depending on a pulse width of said current.

12. The domain wall motion element according to claim 1, further comprising: a magnetoresistance element whose resistance value varies depending on a magnetization state of said center region of said magnetic recording layer.

13. The domain wall motion element according to claim 12,
   wherein said magnetoresistance element comprises:
   said center region of said magnetic recording layer;
   a magnetization fixed layer that is a ferromagnetic layer whose magnetization direction is fixed; and
   a nonmagnetic layer sandwiched between said center region and said magnetization fixed layer,
   wherein said magnetization fixed layer faces said center region across said nonmagnetic layer.

14. The domain wall motion element according to claim 12,
   wherein said magnetoresistance element comprises:
   a magnetization free layer that is a ferromagnetic layer;
   a magnetization fixed layer that is a ferromagnetic layer whose magnetization direction is fixed; and
   a nonmagnetic layer sandwiched between said magnetization free layer and said magnetization fixed layer,
   wherein said magnetization free layer is magnetically coupled to said center region of said magnetic recording layer, and
   a magnetization state of said magnetization free layer varies depending on the magnetization state of said center region.

15. A magnetic random access memory of a domain wall motion type comprising a plurality of memory cells that are arranged in an array form,
   wherein each of said plurality of memory cells comprises a domain wall motion element,
   wherein said domain wall motion element comprises a magnetic recording layer that is formed of a ferromagnetic film and has a domain wall,
   wherein said magnetic recording layer comprises:
   a pair of end regions whose magnetization directions are fixed; and
   a center region sandwiched between said pair of end regions, in which said domain wall moves,
   wherein a first trapping site by which said domain wall is trapped is formed at a boundary between said end region and said center region,
   at least one second trapping site by which said domain wall is trapped is formed within said center region,
   a potential difference for trapping said domain wall at said first trapping site is a first potential difference, and
   a potential difference for trapping said domain wall at said second trapping site is a second potential difference that is smaller than said first potential difference.

* * * * *